US010006951B1

(12) United States Patent
Tsironis (10) Patent No.: US 10,006,951 B1
(45) Date of Patent: Jun. 26, 2018

(54) STABLE LOAD PULL OPERATION USING TUNERS

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 137 days.

(21) Appl. No.: 15/091,165

(22) Filed: Apr. 5, 2016

(51) Int. Cl.
*G01R 27/28* (2006.01)
*G01R 31/26* (2014.01)

(52) U.S. Cl.
CPC ......... *G01R 27/28* (2013.01); *G01R 31/2608* (2013.01)

(58) Field of Classification Search
CPC ............................ G01R 27/28; G01R 31/2608
USPC ....... 324/600, 638, 637, 76.11, 76.14, 76.56, 324/500, 525, 756.06
See application file for complete search history.

(56) References Cited

U.S. PATENT DOCUMENTS

| 6,674,293 B1 | 1/2004 | Tsironis | |
| 8,466,758 B1 * | 6/2013 | Tsironis | H01P 5/04 333/17.3 |
| 9,602,072 B1 * | 3/2017 | Tsironis | H01P 5/04 |

OTHER PUBLICATIONS

"Computer Controlled Microwave Tuner—CCMT", Product Note 41, Focus Microwaves, Jan. 1998.
Load Pull System, http://www.microwaves101.com/encyclopedia/loadpull.cfm#definitions.
Stability Factor, http://www.microwaves101.com/encyclopediasistability-factor.
Corona Breakdown in high power slide screw tuners, http://www.focus-microwaves.com/questions/tuner-power-handling-limitations.
"High resolution tuners eliminate load pull performance errors", Application Note 15, Focus Microwaves, Jan. 1995.
Stability Factor K, Agilent Technology Literature, http://cp.literature.agilent.com/litweb/pdf/genesys200801/sim/measurements_linear/m_stability_factor.htm.

* cited by examiner

*Primary Examiner* — Melissa Koval
*Assistant Examiner* — Trung Nguyen (57) ABSTRACT

Load Pull tuning pattern and probe movement algorithms allow creating a test pattern allowing to avoid instability regions and spurious oscillations of microwave transistors during testing using slide screw load and source tuners. The impedances are selected based on the stability circle and instability area on the Smith chart and the probe movement trajectory allows both avoiding the static and circumventing the transient crossing through the instability area. All tuning commands are saved in a pattern file.

6 Claims, 10 Drawing Sheets

STABLE LOAD PULL OPERATION USING TUNERS

PRIORITY CLAIM

Not Applicable

CROSS-REFERENCE TO RELATED ARTICLES

1. "Computer Controlled Microwave Tuner—CCMT", Product Note 41, Focus Microwaves, January 1998
2. Load Pull System, http://www.microwaves101.com/encyclopedia/loadpull.cfm#definitions
3. Stability Factor, http://www.microwaves101.com/encyclopedias/stability-factor
4. Tsironis, U.S. Pat. No. 6,674,293, "Adaptable prematched tuner system and method"
5. Corona Breakdown in high power slide screw tuners, http://www.focus-microwaves.com/questions/tuner-power-handling-limitations
6. "High resolution tuners eliminate load pull performance errors", Application Note 15, Focus Microwaves, January 1995.
7. Stability Factor K, Agilent Technology Literature, http://cp.literature.agilent.com/litweb/pdf/genesys200801/sim/measurements_linear/m_st ability_factor.htm

BACKGROUND OF THE INVENTION, PRIOR ART

This invention relates to using automatic slide screw impedance tuners in load pull testing power transistors; the tuners allow synthesizing appropriate RF reflection factor vectors Γ (or complex impedances Z) at the input and output of the transistors, see ref. 1.

Figure 1:
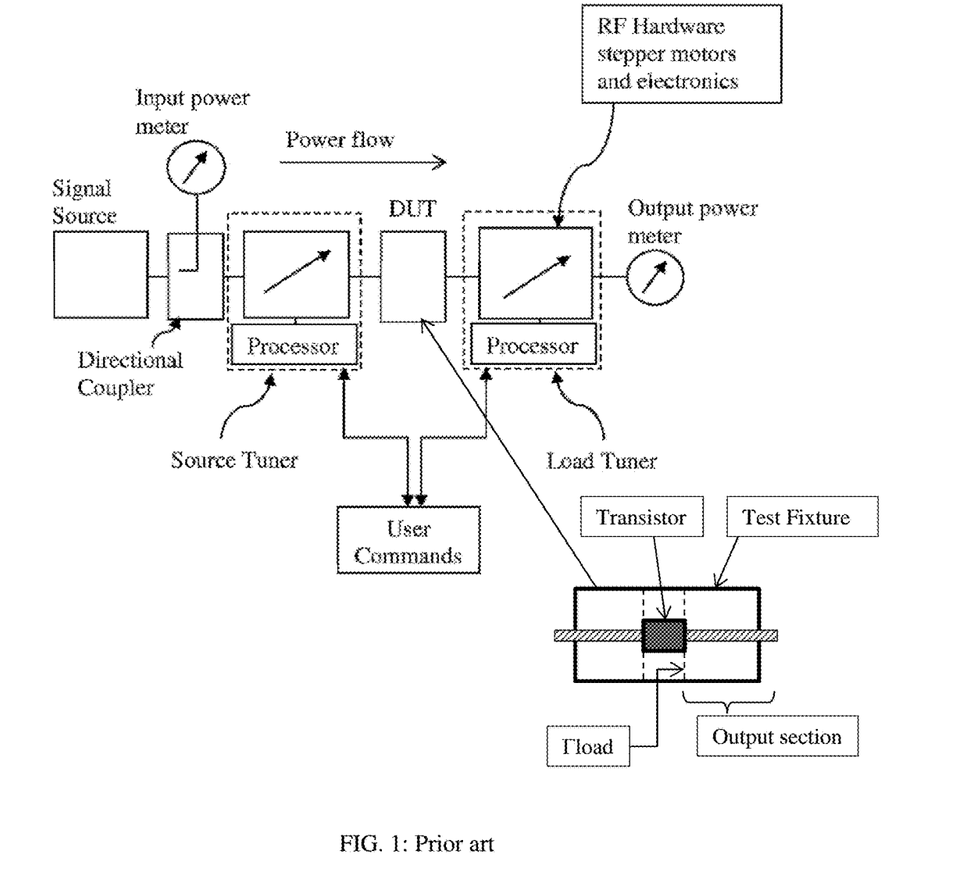
FIG. 1 depicts prior art: the block diagram of a passive load pull test system using a source and a load impedance tuner. The tuners and instruments are remotely controlled by a computer.

A popular method for testing and characterizing RF transistors (device under test, DUT) for high power is "load pull" or "source pull". Load pull (or source pull) are automated measurement techniques used to measure Gain, Power, Efficiency and other characteristics of the DUT, employing source and load impedance tuners and other test equipment, such as signal sources, directional couplers, test fixtures to house the DUT and input and output power meters (FIG. 1, see ref. 2). The tuners are computer controlled using appropriate algorithms and allow scanning the RF impedance conditions systematically under which the DUT is tested. During these tests the DUT is biased and receives RF power at its input port (FIG. 1); depending on the source and load impedance conditions the DUT may enter into a condition of instability (see ref. 3 and 7), i.e. becoming an oscillator, adding its own power to the externally injected RF power in which case any measurement is impossible.

Figure 2:
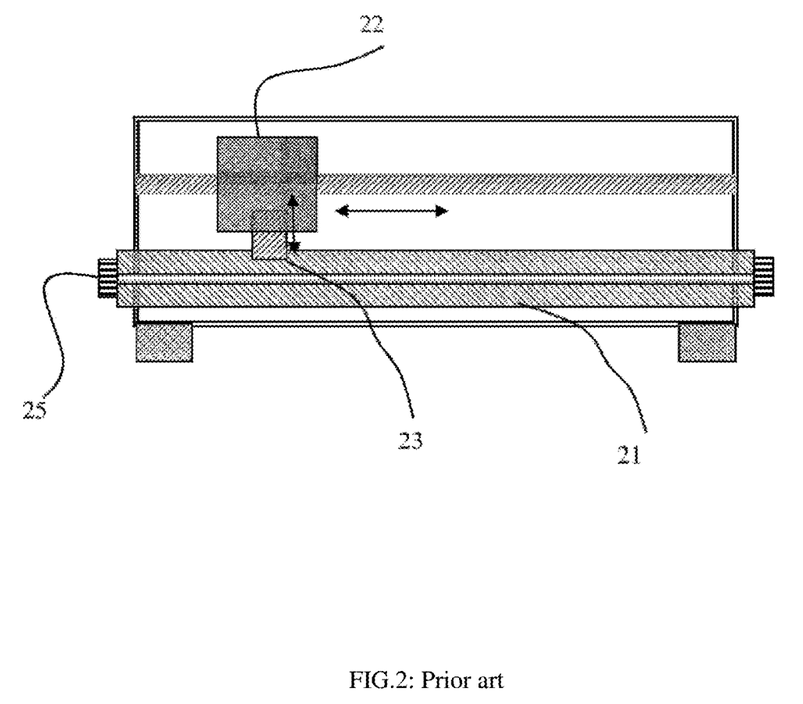
FIG. 2 depicts prior art: a schematic front view of a, single probe, motorized (automated) slide screw impedance tuner for microwave frequencies.
Figure 3:
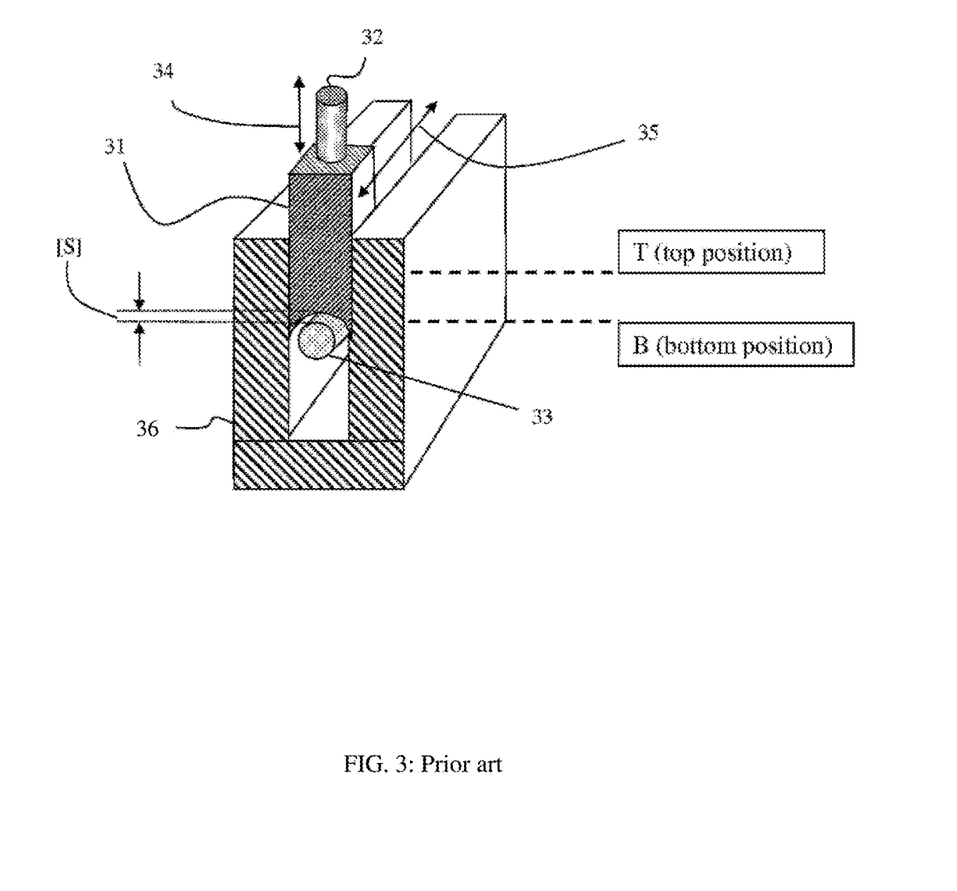
FIG. 3 depicts prior art: a perspective view of a section through a slabline with center conductor and capacitive metallic probe (slug) and the key dimensions of the probe and possible movements and limitations.

A popular family of electro-mechanical (automated) tuners are the "slide-screw tuners" of which a simplified front view is shown schematically in FIG. 2. They comprise a slotted low loss airline (slabline (21)) and two ports, an input port and an output port, of which the test port (25) is adjacent to the DUT and the other is the idle port; one or more remotely controlled mobile carriages (22), which can travel parallel to the axis of the slabline, and carry RF probes (23), see ref. 4. FIG. 3 shows a perspective cross section of a slabline (36) and a tuner probe (31) also called "slug". The probe is insertable (34) into and can slide vertically inside the slot of the slabline (36). The probe can also move horizontally (35) with the carriage, parallel to the center conductor (33). Typically the probe is made of conductive material (metal) and is attached to a highly precise vertical axis (32) (see ref. 4). The vertical axis is driven by a precision screw drive and electronically controlled stepper motors and allows very accurate control of the distance between the bottom of the probe (31) and the center conductor (33), marked [S] in FIG. 3. Wide (long) probes are used for low frequencies, narrow (short) probes for high frequencies. The probes have a concave bottom so that they create high capacitive coupling between the center conductor (33) and a grounded conductive body (slabline sidewalls (34)).

The term "programmable (impedance) tuner" is defined as used here: a "programmable instrument" is an instrument that can receive high level electronic commands corresponding to its main function, through a communication channel (wired: GPIB, LAN, USB or wireless: Bluetooth or Wi-Fi) and execute them; for instance a programmable signal source accepting corresponding commands can generate a signal and set the frequency and amplitude of the signal; in that sense a "programmable tuner" is an instrument that can understand "tuning" commands and synthesize (create) user-defined reflection factors (impedances) at a certain frequency; i.e. not only commands instructing the tuner to "move" the probes; a programmable tuner comprises not only the mechanical and electronic hardware parts (slabline, probes, gear, motors and motor control electronics) but also a control processor which can be either external (laptop or desk computer) or internal processor (included in the tuner housing). This processor not only can directly move the motors, but also process the received high level commands (such as "tune to 10,-25 Ohm", considering Z=R+jX), use calibration data to calculate the required probe settings (coordinates) for this to happen, convert them to motor movements of the carriage and the vertical axis and generate the requested impedance as shown in FIG. 1.

Figure 4:
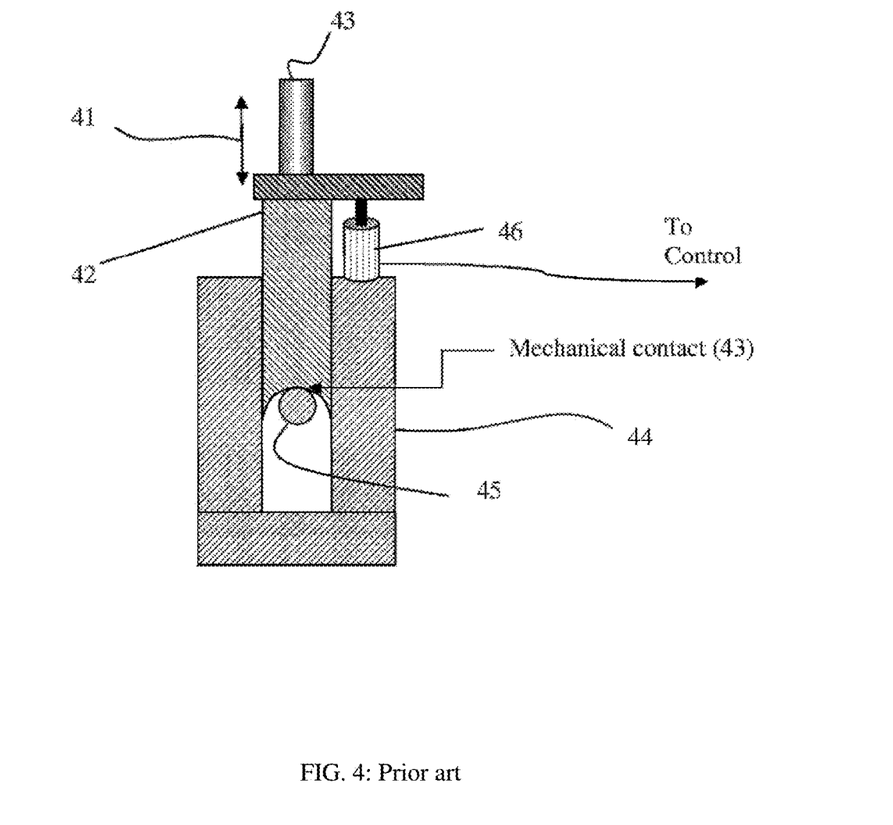
FIG. 4 depicts prior art: a cross section of the metallic probe (slug) approaching the center conductor in a slabline and a method to prevent mechanical contact of the probe to the center conductor using an electro-mechanical limit switch.

When the probe (42) in a slide screw tuner under power (FIG. 4), comes too close to the center conductor (45) a "short circuit" occurs. This has to be avoided, because it may destroy the DUT and, even if the DUT survives, no meaningful measurement is possible (see ref. 4). Against popular belief corona discharge (sparking) does not happen only when the voltage V is thousands or millions of Volts (typical in "lightning"). All depends on S (and other, secondary conditions, such as air pressure, humidity etc.), the DC voltage and the RF power. The value of the electric field $E_s$ at which corona discharge "through vacuum" happens is approximately 3.5-4 MV/m (3.5 to 4,000,000V/meter). If S=40 μm (a value currently realistic in commercial slide screw tuners as discussed here), then the voltage needed for corona is 160V, which corresponds to RF power of 512 Watts on a 50 Ohm resistance ($P=V^2/R$). This is not millions or thousands of Volts and, depending on associated impedances, may be caused by often used RF power (see ref. 5); when using dielectric with $\epsilon_r > 1$ then the corona occurs at higher voltage.

Figure 5:
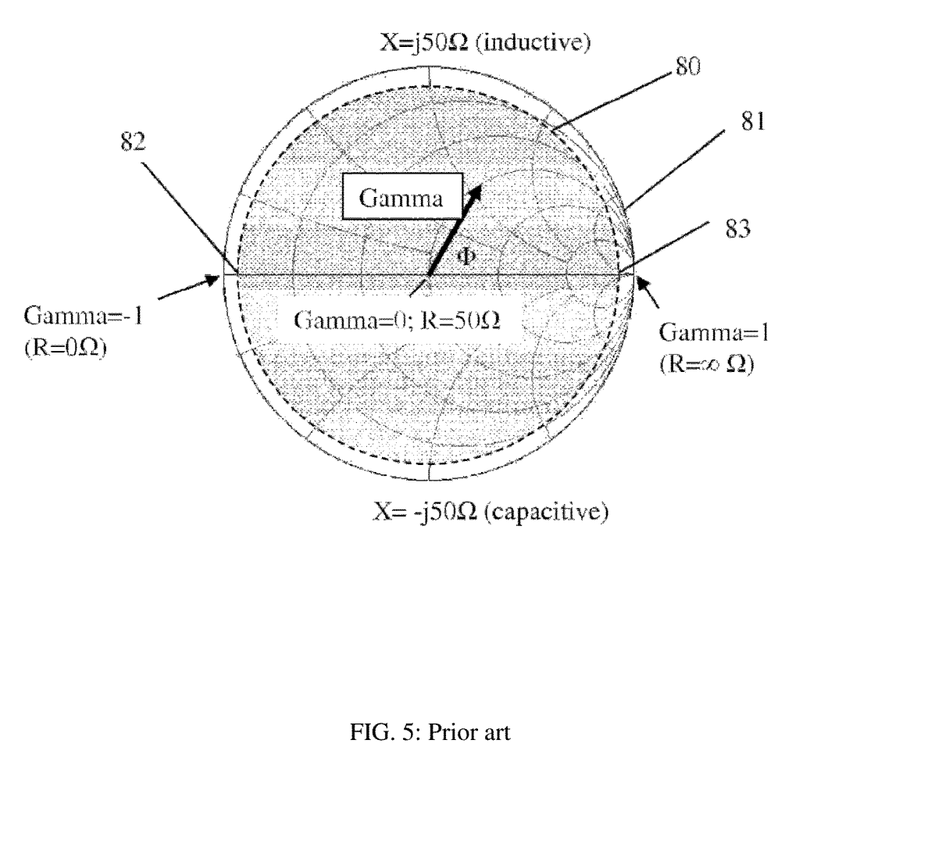
FIG. 5 depicts prior art: the tuning range of a slide screw tuner at a given frequency in the Smith chart (reflection factor plan). The tuning range (shaded area) is reduced due to, among other, the insertion loss in connectors and transmission line (slabline). Prevalent relation is: Z=R+jX=Zo* (1+Γ)/(1−Γ); Zo=50Ω; Γ=|Γ|*exp(jΦ).

FIG. 5 shows the "tuning range" of passive tuners on a reflection factor plan (Smith Chart (81)). Maximum possible tuning range is 1, but limited capacitance values between probe and center conductor, because of the risk of corona discharge and insertion loss in the slabline between test port and probe location (FIG. 2) limit the tuning range to a maximum value, as shown by the shaded area (80) (see ref. 1 and 6).

Consider a situation whereby the RF probe (slug) in inserted close to the center conductor and creates high Gamma (Γ), FIG. 5. Keeping the vertical position constant and moving the probe only horizontally, for a given frequency, will create a constant Γ (or constant VSWR) circle. Active RF devices and in particular power transistors have high power gain. Depending on the source and load impedances presented to those devices, internal feedback elements can create spurious oscillations.

Figure 7:
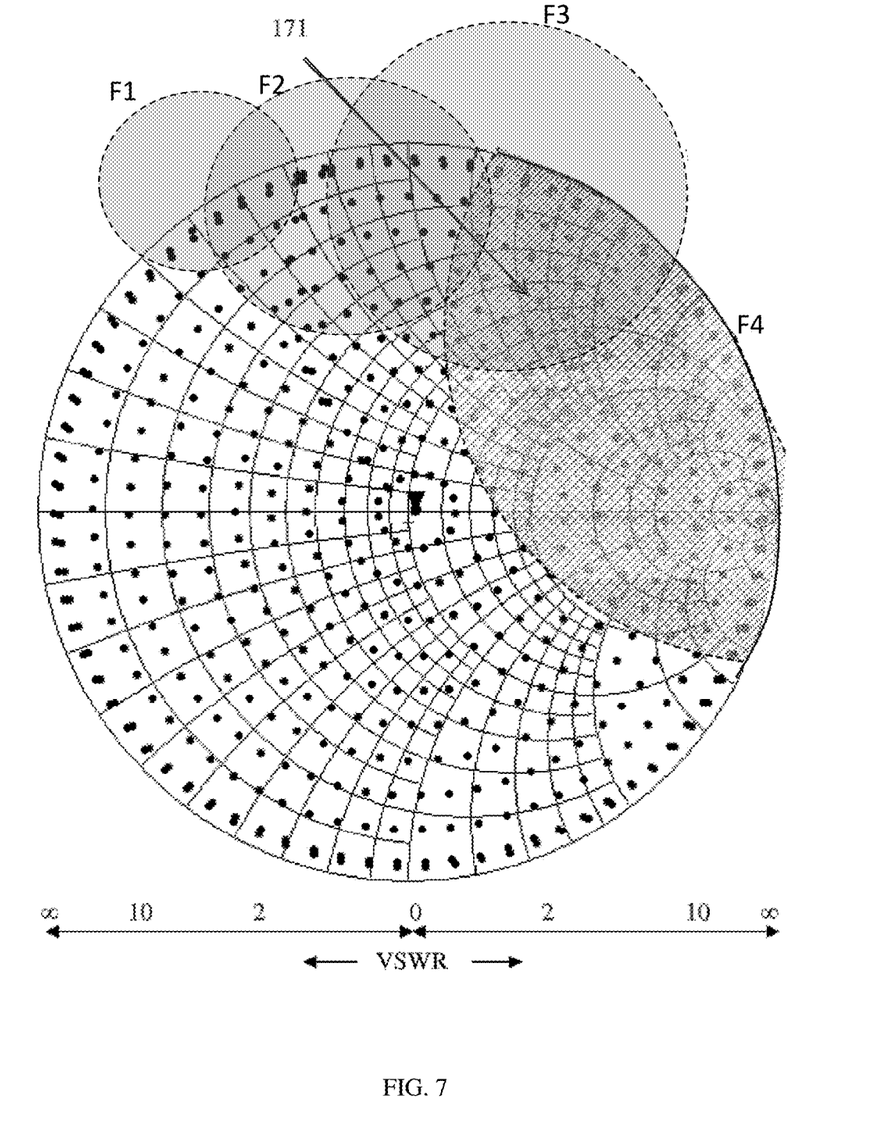
FIG. 7 depicts Smith chart with indication of the stable and unstable DUT areas for a number of frequencies; the areas inside the circles are potentially unstable.

The criterion for instability of the transistor is the Stability Factor K (see ref. 7). K is calculated from the small signal parameters of the transistor (s-parameters) and the locus of K=1 is a circle: the stability circle. If this circle crosses through the load or source Smith chart, then passive load and source impedances attached to the transistor may create instability and spurious oscillations. The actual meaning of the stability circle and the instability area is that, all reflection factors inside the instability area, presented to the DUT at one port will create a negative resistance (or |Γ|>1) at the other port; this may lead to oscillations; if the load and source Γ, which are defined as the total reflection factors, after the output and input sections of the test fixture have been "embedded" into the tuner calibration (see FIG. 1) are at the border or inside the area defined by stability circle K, then the device oscillates. If only the source or load Γ are inside the stability circle then the device "risks" oscillation. This condition shall always be avoided for safe tuning operations. The areas of instability for a number of frequencies are shown as (171) in FIG. 7. When such a spurious oscillation occurs, the power due to the oscillation is superimposed to the RF power injected into the transistors and will falsify the result or destroy the transistor; this invention discloses a tuning pattern and a dynamic tuning method to avoid this phenomenon.

DESCRIPTION OF THE SEVERAL VIEWS OF THE DRAWINGS

The invention and its mode of operation will be more clearly understood by the following description in view of the appended drawings, in which:

FIGS. 10(*a*) and 10(*b*) depict: 10(*a*) depicts definitions of tuner probe movement coordinates; 10(*b*) depicts the actual probe movement trajectory corresponding to FIG. 8.

DETAILED DESCRIPTION OF THE INVENTION

Figure 6:
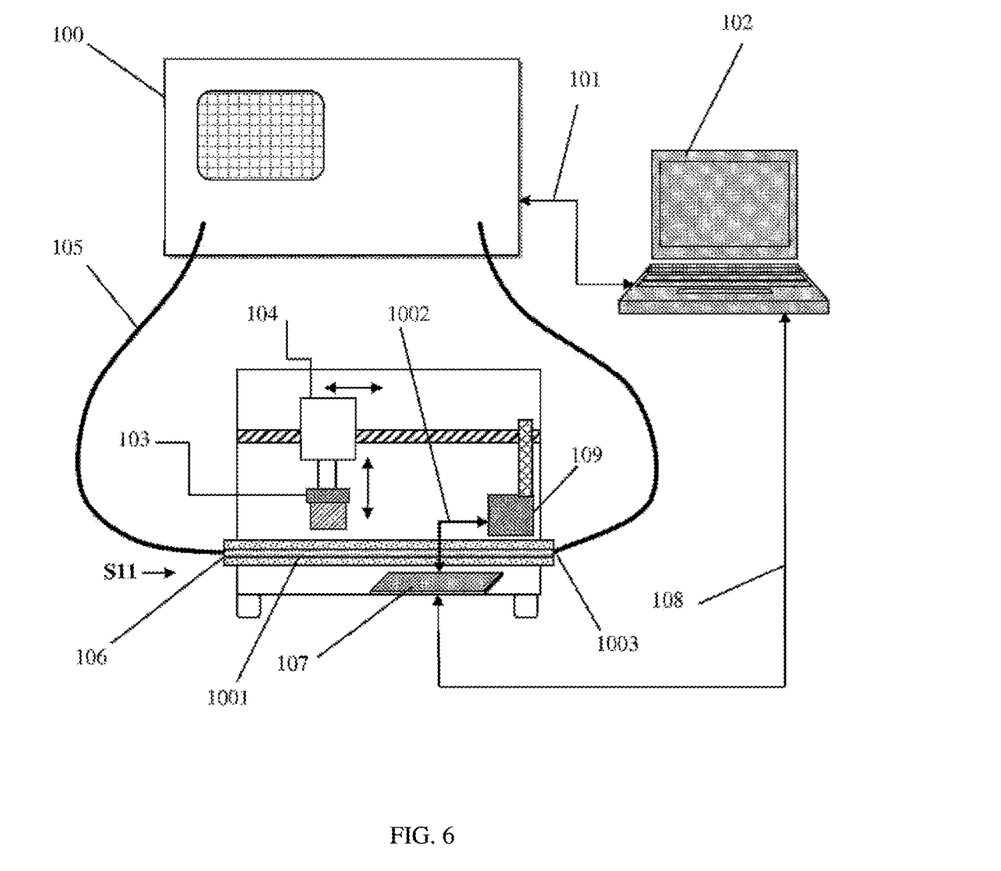
FIG. 6 depicts prior art: a typical test setup used to characterize (calibrate) an RF slide screw tuner on a Vector Network Analyzer (VNA) by measuring its s-parameters as a function of probe coordinates (positions).

The tuner must be pre-calibrated to be used. This is done using a setup as in FIG. 6: It comprises a pre-calibrated Vector Network Analyzer, VNA (100); a system control PC (102), which controls the tuner motors (109) via a digital connection (108), a motor driver electronic circuit (107) and digital cable (1002); RF cables (105) connecting the VNA (100) to the test (106) and idle (1003) tuner ports. The VNA is calibrated at the reference plane of the test port (106) and measures the reflection factor $S_{11}$. The reflection factor $\Gamma_{in}$ at the test port is equal to $S_{11}$ when the impedance connected to the idle port is 50Ω (or $\Gamma_{load}$=0), see equation 1. The carriage (104) can travel horizontally and the probe (103) vertically approaching the center conductor of the slabline (1001). For each probe setting the s-parameters of the tuner are measured and saved in a calibration file for the given frequency. The probe settings are selected to cover the Smith chart. Since the test fixture (FIG. 1) introduces a phase shift, it is usually impossible to select probe states to cover a preset area of the Smith chart. Therefore, preferably, the whole chart is covered.

There are a number of possibilities in generating, validating, saving and executing load pull measurements within the stable area of impedances. The term "validating" is used here to signify that the amplitude and phase of the reflection factors remain outside the potentially unstable area (171) in FIG. 7. This can be determined by calculating the reflection factor at the input of the DUT ($\Gamma_{in}$) as a function of the DUT s-parameters ($S_{ij}$) and the $\Gamma_{load}$ as follows:

$$\Gamma_{in}=S_{12}*S_{21}*\Gamma_{load}/(1-S_{22}*\Gamma_{load}) \qquad \{eq.\ 1\}$$

The $\Gamma_{load}$ points, for which |$\Gamma_{in}$|≥1, are potentially unstable. During the load pull operation $\Gamma_{load}$ is created by the tuner $S_{11}$ at its test port, as long as the tuner itself is terminated with 50Ω; if this is not the case appropriate calibration of the setup components and corrections are applied. In a first embodiment the validated test impedances for a specific frequency and all associated motor control instructions for positioning the probe are saved in a script (MACRO) file as follows: The impedance points of the load pull impedance pattern are a) selected,
b) validated concerning spurious oscillations,
c) probe coordinates for all corresponding impedances are calculated,
d) associated motor movement instructions, as described so far, are determined and
e) saved in a "MACRO load pull file" (script file) to be retrieved and executed later in a load pull operation.

In a second embodiment only the impedance points of the load pull pattern are saved in the "MACRO impedance pattern file", for a specific frequency. This can be done by hand, point by point, or through a simple algorithm generating a grid of points within given boundaries and saved in the MACRO file. It is during the load pull operation that
a) the impedance points of the MACRO impedance pattern file are retrieved,
b) validated concerning risk for spurious oscillations,
c) the associated probe positions are calculated, using the tuner and test fixture calibration data, and
d) the load pull operation (probe movement and data acquisition and saving) is executed.

Figure 8:
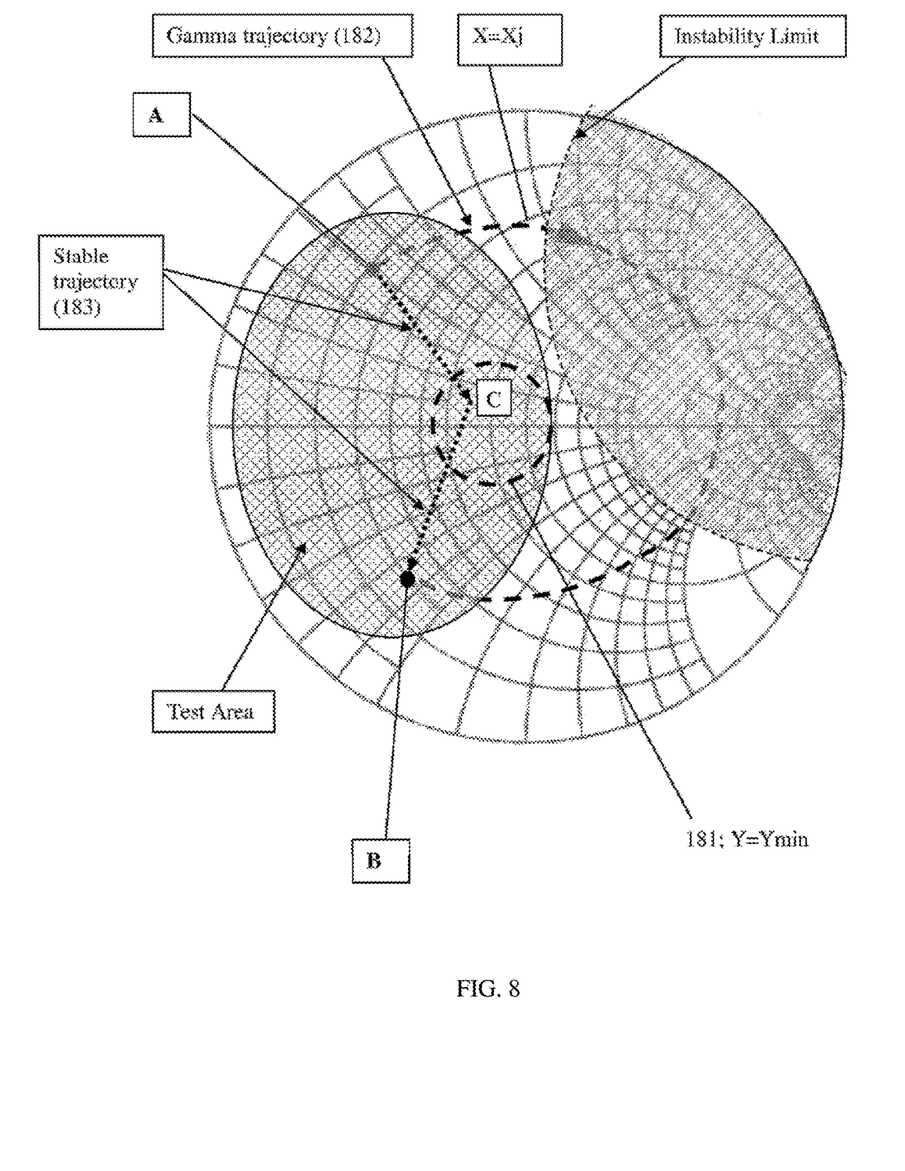
FIG. 8 depicts tuning areas and patterns and tuning trajectory between points A and B, for avoiding crossing through unstable areas.

As already discussed before the probe movement shall not cross an area in the Smith chart, that may cause transient oscillations. The concept is shown in FIG. 8. It is in general ignored that a slide screw tuner, in order to tune between two points "A" and "B", which are both inside the stable region of the Smith chart, may have to travel on an "unstable" trajectory (182) covering more than 180 degrees; this happens if the two points, unbeknown to the user, lie one at the beginning phase of the calibration (here point "A") and the other at the end (here point "B"). If this happens, a transient oscillation may occur, during the movement of the tuner carriage/probe during the crossing through the instability area. This must be avoided. The only way is to create a safe trajectory.

The solution disclosed here consists of creating a probe movement pattern file which will allow the tuner to move from point "A" (with probe coordinates $(X_A, Y_A)$) to point "B" (with probe coordinates $(X_B, Y_B)$) without crossing through the instability area. This is the trajectory (183): From the point "A", in a first step, the probe is withdrawn, (first half of the trajectory (183), between points "A" and "C") reducing this way the reflection factor within a safe area (181). This corresponds to a partially or totally withdrawal of the probe at a penetration depth Y=Ymin: the tuner moves from point "A" $(X_A, Y_A)$ to point "C" $(X_C, Y_{min})$. Both points are stable. Then the carriage moves horizontally on the (stable) circle (181) from $X_C$ to $X_B$ until it reaches the expected horizontal position $(X_B)$ corresponding to point "B". Then the probe is inserted to the final depth $Y_B$ following the second part of the trajectory (183), between points "C" and "B".

Figure 9:
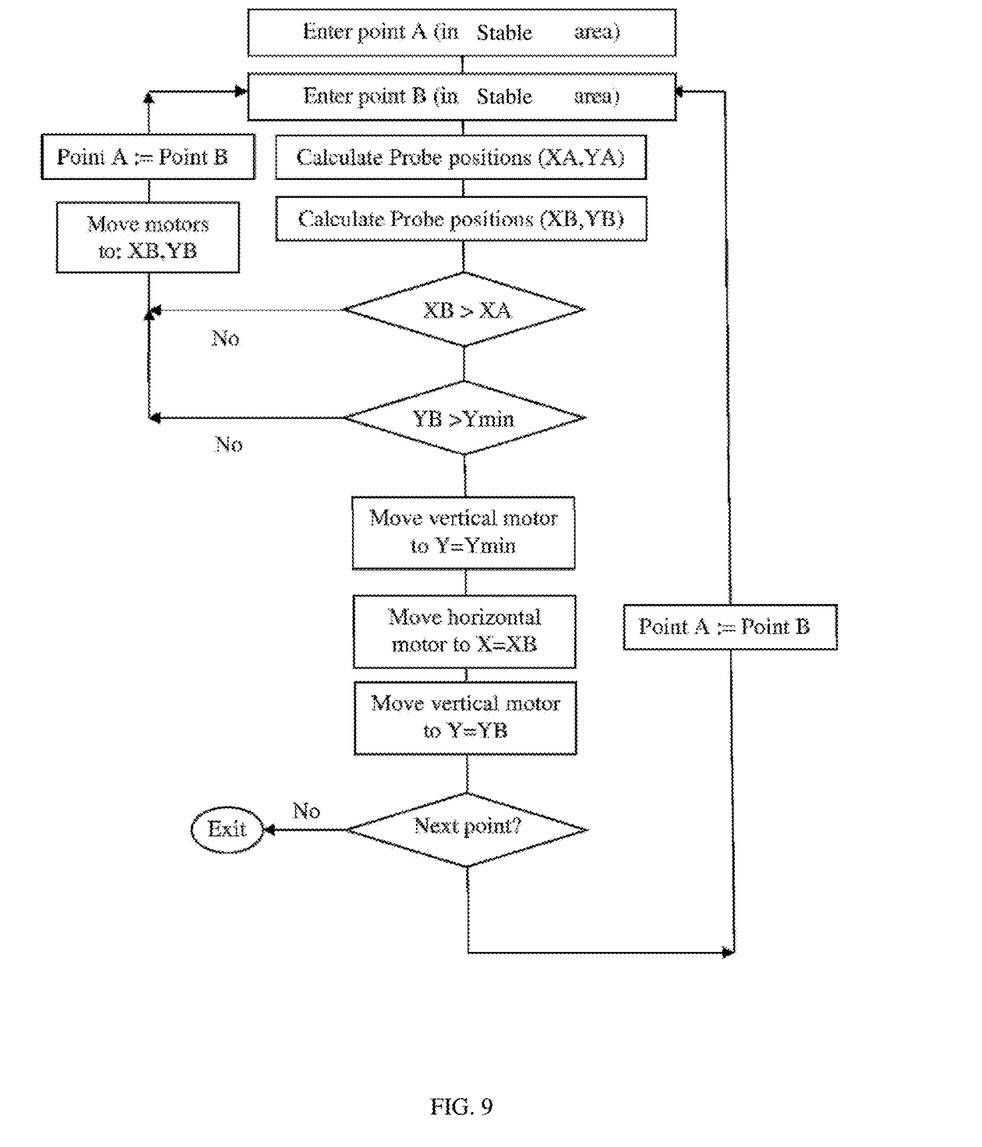
FIG. 9 depicts a flowchart for generating the probe coordinates reflection factor trajectory and probe movement instructions in order to avoid crossing through high electric field areas.
Figure 10A:
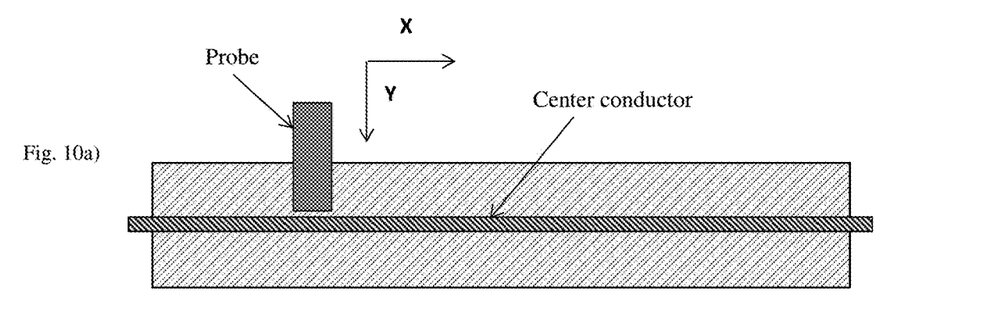
Figure 10B:
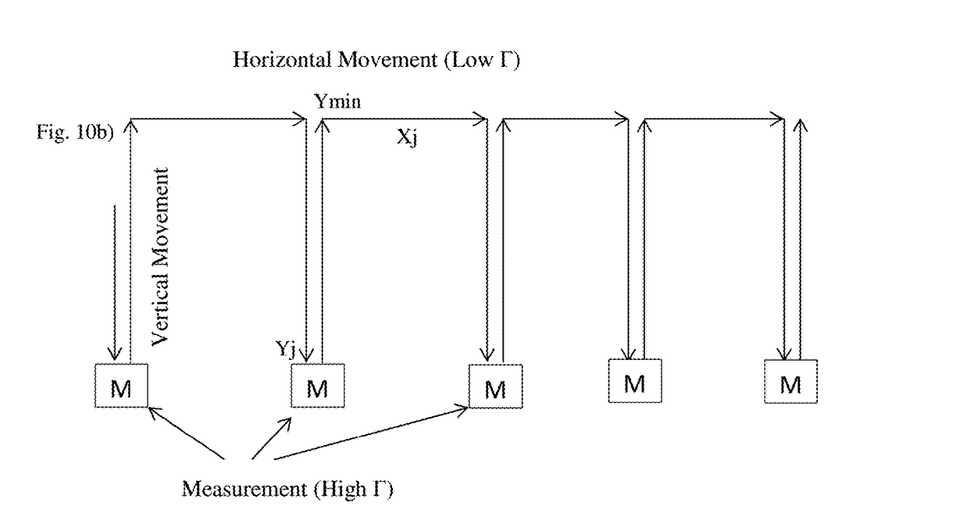

The method for creating the reflection factor pattern required for stable operation comprises, therefore, the following steps:
a) The tuner calibration data are retrieved from stored file;
b) S-parameter calibration data of the test fixture are retrieved from stored file;
c) The s-parameters of the output section of the test fixture are cascaded with the tuner calibration data and saved in a new setup calibration file;
d) S-parameters of the DUT are retrieved;
e) A reflection factor ($\Gamma$) pattern is created that contains up to N points ($\Gamma_1 \ldots \Gamma_N$); typical values for N is between 50 and 100 points;
f) A software routine steps through all points $\Gamma_i (1 \leq i \leq N)$ and calculates the reflection factor $\Gamma_{in}$ at the DUT input as a function of $\Gamma i$, and eliminates all $\Gamma_i$ for which $|\Gamma_{in}(\Gamma_1)| \geq 1$; the remaining points are renumbered then to $\Gamma_j$, whereby $1 \leq j \leq M$ and whereby $M \leq N$;
g) Another software routine steps through all points $\Gamma_j$ ($1 \leq j \leq M$) and calculates the associated horizontal and vertical coordinates $(X_j, Y_j)$ of the tuner probe using the setup calibration data created in step c);
h) Subsequently, two sets of coordinates $(X_j, Y_{min})$, $(X_{j+1}, Y_{min})$, are added after every remaining $(X_j, Y_j)$ set to the total list of coordinates, whereby $Y_{min}$ is the vertical position of the probe, for which the reflection factor presented to the DUT at its output port is small (approximately 0.1 or less);
i) All sets of the probe coordinates of step h) are then saved as follows: $(X_1, Y_1), (X_1, Y_{min}), (X_2, Y_{min}), (X_2, Y_2), (X_2, Y_{min}), (X_3, Y_{min}), (X_3, Y_3)$, etc, together with the associated reflection factor $\Gamma$, in a pattern file; that means, each time before the carriage moves horizontally, the probe is withdrawn to reduce the reflection factor presented to the DUT during the horizontal movement. The actual pattern generation algorithm is shown in the flowchart of FIG. 9; the final probe movement is shown in FIG. 10(b) whereby FIG. 10(a) clarifies the definition of the probe movement coordinates; every time the probe "dips" to the actual position a measurement is taken and the probe is withdrawn before the carriage moves horizontally.

The section of the test fixture inserted between the tuner test ports and the DUT terminals (FIG. 1) determines the actual reflection factors, both presented to the DUT and calculated at the input tuner test port. It needs to be clarified that, for the DUT to actually oscillate both ports must be terminated within the unstable region. Since, however all components in the setup are wideband, i.e. the DUT has considerable gain at any frequency, from DC to high GHz range, as shown by the wideband (frequencies F1, F2, F3, F4 . . . ) stability circles in FIG. 7, that the tuners are typically also wideband, covering several frequency octaves, the test procedure must proceed with caution. It is not secure enough to determine that a specific set of source and load reflection factors satisfies the stability conditions at a specific frequency, since it is possible that at another frequency this will not be the case. This is why the proposed solution errs towards safety. The test fixture s-parameters (FIG. 1) are embedded into the tuner calibration files using s-parameter cascading and then these new data are used as "expanded" tuner calibration data. Alternatively the test fixture s-parameters can be cascaded with the DUT s-parameters and used together with the original tuner calibration data. The stability conditions are either valid or invalid independently on the used reference plane.

The parameters to be measured by the load pull system vary depending on the application. The method disclosed here is valid for measuring any DC or RF parameter; their specific definitions are irrelevant to the method and they will always be falsified by the DUT spurious oscillations.

Obvious alternative algorithms of the above method and dynamic probe movement limiting mechanisms are imaginable, but their effect will always be to introduce stable test conditions for all probe trajectories. The obvious variations, however, shall not impede on the validity and general coverage of the claims of the hereby described concept of using a dynamic moving trajectory routine for preventing the probes in slide screw tuners from creating transistor instabilities.

What is claimed is:

1. A method allowing stable (spurious oscillation-free) load pull measurement of microwave transistors (DUT) using calibrated programmable electro-mechanical slide-screw impedance tuners,
wherein
the tuners comprise input (test) and output (idle) ports and a slotted airline between the ports;
and at least one reflective probe remotely movable along and insertable into the airline slot, and appropriate probe positioning gear, control electronics, firmware and a system control computer;
and wherein the tuner calibration data comprising s-parameters of the tuner for a multitude of probe positions are saved in a tuner calibration file;

said method comprising a) generating and using reflection factor tuning pattern ensuring stable transistor DUT operation;

b) tuner probe movement trajectory allowing spurious oscillation-free load pull; whereby the reflection factor pattern excludes points in the instability area of the transistor DUT, and wherein the movement trajectory of the probe(s) circumvents the instability area of the transistor DUT.

2. Reflection factor tuning pattern as in claim 1 comprising a multitude of reflection factor points, whereby each point included in instability area of the transistor DUT is eliminated from the pattern.

3. The tuner probe movement trajectory as in claim 2, whereby the probe is withdrawn from the slabline before moving horizontally.

4. The method as in claim 3, whereby the DUT is mounted in a test fixture of which the s-parameters of the input and output sections are saved in a fixture calibration file.

5. A method for creating the reflection factor pattern, as in claim 4, comprising the following steps:

a) retrieve the tuner calibration data from file;

b) retrieve s-parameter calibration data of the test fixture from file;

c) cascade the s-parameters of the output section of the test fixture with the tuner calibration data and save in a setup calibration file;

d) retrieve the s-parameter matrix of the DUT, [Sab] whereby {a, b}={1,2};

e) create a reflection factor ($\Gamma$) pattern comprising N points ($\Gamma_1 \ldots \Gamma_N$);

f) step, in computer memory, through all points $\Gamma_i$ ($1 \le i \le N$), calculate g) the input reflection factor $\Gamma_{in}$ of the DUT "$\Gamma_{in}$ (Sab, $\Gamma_i$)" and eliminate all reflection factors $\Gamma_i$, for which $|\Gamma_{in}(Sab, \Gamma_i)| \ge 1$;

h) step, in computer memory, through all remaining points $\Gamma_j$ ($1 \le j \le N$) and calculate the associated horizontal and vertical coordinates ($X_j, Y_j$) of the tuner probe using the setup calibration data created in step c);

i) add, after every set ($X_j, Y_j$), two sets of coordinates ($X_j, Y_{min}$), ($X_{j+1}, Y_{min}$), whereby $Y_{min}$ is the withdrawn vertical position of the probe, for which the reflection factor presented to the DUT at its output port is outside the instability area;

j) save all sets of the probe coordinates of step i) as follows: ($X_1, Y_1$), ($X_1, Y_{min}$), ($X_2, Y_{min}$), ($X_2, Y_2$), ($X_2, Y_{min}$), ($X_3, Y_{min}$), ($X_3, Y_3$), etc., and the associated reflection factor $\Gamma$ in a pattern file.

6. The method as in claim 1, comprising the following steps:

a) retrieve probe coordinates from the pattern file as in claim 5;

b) move the probe to the coordinates retrieved in step a);

c) measure RF and DC parameters (Gain, Power, Intermod, Efficiency, etc.) of DUT;

d) save DUT parameters and associated reflection factors in a load pull data file.

* * * * *

UNITED STATES PATENT AND TRADEMARK OFFICE
CERTIFICATE OF CORRECTION

PATENT NO. : 10,006,951 B1
APPLICATION NO. : 15/091165
DATED : June 26, 2018
INVENTOR(S) : Christos Tsironis It is certified that error appears in the above-identified patent and that said Letters Patent is hereby corrected as shown below:

In the Claims

Numbering in Claim 5 is incorrect:
Currently:
e) create a reflection factor ($\Gamma$) pattern comprising N points ($\Gamma_1 \ldots \Gamma_N$);
f) step, in computer memory, through all points $\Gamma_i$ ($1 \leq i \leq N$), calculate
g) the input reflection factor $\Gamma_{in}$ of the DUT "$\Gamma_{in}$ (Sab, $\Gamma_i$)" and eliminate all reflection factors $\Gamma_i$, for which $|\Gamma_{in}$ (Sab, $\Gamma_i$)$|\geq 1$;
h) step, in computer memory, through all remaining points $\Gamma_j$ ($1 \leq j \leq N$) and calculate the associated horizontal and vertical coordinates ($X_j$, $Y_j$) of the tuner probe using the setup calibration data created in step c);
i) add, after every set ($X_j$,$Y_j$), two sets of coordinates ($X_j$,$Y_{min}$), ($X_{j+1}$,$Y_{min}$), whereby $Y_{min}$ is the withdrawn vertical position of the probe, for which the reflection factor presented to the DUT at its output port is outside the instability area;
j) save all sets of the probe coordinates of step i) as follows: ($X_1$, $Y_1$), ($X_1$, $Y_{min}$), ($X_2$, $Y_{min}$), ($X_2$, $Y_2$), ($X_2$, $Y_{min}$), ($X_3$, $Y_{min}$), ($X_3$, $Y_3$), etc., and the associated reflection factor $\Gamma$ in a pattern file.

Whereby step g) is in fact part of step f) and should be:
f) step, in computer memory, through all points $\Gamma_i$ ($1 \leq i \leq N$), calculate the input reflection factor $\Gamma_{in}$ of the DUT "$\Gamma_{in}$ (Sab, $\Gamma_i$)" and eliminate all reflection factors $\Gamma_i$, for which $|\Gamma_{in}$ (Sab, $\Gamma_i$)$|\geq 1$;
g) step, in computer memory, through all remaining points $\Gamma_j$ ($1 \leq j \leq N$) and calculate the associated horizontal and vertical coordinates ($X_j$, $Y_j$) of the tuner probe using the setup calibration data created in step c);
h) add, after every set ($X_j$,$Y_j$), two sets of coordinates ($X_j$,$Y_{min}$), ($X_{j+1}$,$Y_{min}$), Signed and Sealed this
Eighteenth Day of June, 2019

Andrei Iancu
*Director of the United States Patent and Trademark Office*